(12) United States Patent
Hunt

(10) Patent No.: US 6,822,305 B2
(45) Date of Patent: Nov. 23, 2004

(54) OPTICAL INTEGRATED CIRCUIT

(75) Inventor: Jeffrey H. Hunt, Chatsworth, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/120,585

(22) Filed: Apr. 11, 2002

(65) Prior Publication Data

US 2003/0194824 A1 Oct. 16, 2003

(51) Int. Cl.$^7$ .......................................... H01L 31/0232
(52) U.S. Cl. ........................ 257/432; 438/22; 438/31
(58) Field of Search ......................... 257/432; 385/14, 385/40, 43, 47–50, 52, 130–132, 142, 144, 147; 437/24, 26; 438/22, 23, 31, 32, 960

(56) References Cited

U.S. PATENT DOCUMENTS

| | | | |
|---|---|---|---|
| 4,114,257 A | * | 9/1978 | Bellavance ............... 438/24 |
| 6,297,095 B1 | | 10/2001 | Muralidhar et al. |
| 6,319,427 B1 | | 11/2001 | Ozin et al. |
| 6,343,171 B1 | * | 1/2002 | Yoshimura et al. ........... 385/50 |
| 2003/0089899 A1 | * | 5/2003 | Lieber et al. ............... 257/9 |

OTHER PUBLICATIONS

Soref, "Application of Silicon–Based Optoelectronics", Mat. Res. Bull., 23(4), p 20–24 (1998).*

D. Lim, et al; Optical Second Harmonic Spectroscopy of Boron–Reconstructed Si(001); Physical Review Letters; Apr. 10, 2000; vol. 84, No. 15; pp. 3406–3409.

Howard W. H. Lee, et al; Nonlinear Optical Properties and Applications of Silicon and Germanium Quantum Dot Nanocomposites; Trends in Optics and Photonics; Aug. 6–10, 2000; vol. 46; pp. 12/MA4–1–MA42/13.

L. Pavesi, et al; Optical Gain in Silicon Nanocrystals; Nature; Nov. 23, 2000; vol. 408; pp. 440–444.

* cited by examiner

Primary Examiner—Asopk Kumar Sarkar
(74) Attorney, Agent, or Firm—Ingrassia Fisher & Lorenz, P.C.

(57) ABSTRACT

The optical integrated circuit includes a substrate; and, a plurality of optical elements supported by the substrate being optically coupled with each other, each optical element comprising silicon nanoclusters and having a desired opto-physical interaction with light impinging thereon. These optical elements may be, for example, optical sources, optical waveguides, optical switches and optical detectors.

13 Claims, 1 Drawing Sheet

OPTICAL INTEGRATED CIRCUIT

BACKGROUND OF THE INVENTION

1. Field of the Invention

The present invention relates to integrated circuits and more particularly to an optical integrated circuit that uses optical elements formed of silicon nanoclusters.

2. Description of the Related Art

Photonics and optoelectronics are the terms used to describe interactions between optical and electronic physical phenomena. This can involve the changing of electrical signals into optical signals or the reverse. It can involve the modulation of electronic signals by interactions with optical signals or the reverse. Since crystalline silicon is the dominant material in microelectronics, there has been intensive research to develop silicon as an optoelectronic material. Since silicon manufacturing techniques are very mature, photonic applications could be rapidly realized if the optical interactions could be mediated in silicon structures. Under normal circumstances and conditions, silicon is an indirect band gap semiconductor, unable to emit light efficiently or fast. Optical signal processing, routing and switching is highly desirable because the speeds associated with light are much higher than those associated with electronic interactions. Moreover, photons are not affected by magnetic fields, and optical signals can cross one another without interference. These features provide great incentive to develop photonics in place or as an adjunct to electronics in many applications. Accordingly, the quest for silicon based photonic devices remain a major research activity. Existing prior art discusses only component level implementations of the silicon devices without an attempt to unify their implementations.

For example, U.S. Pat. No. 6,297,095, issued to Muralidhar et al., discloses the use of silicon nanoclusters to create a memory device with a floating gate. The patent also discusses techniques useful in the manufacturing of the device. However, there is no discussion regarding integrating this device with any other kind of optical element.

U.S. Pat. No. 6,319,427, issued to Ozin et. al., discloses the use of silicon nanoclusters capable of photoluminescence to emit fast photons. There is discussion of the means for preparing the nanoclusters. Mention is made that the specific means for manufacture of these optoelectronic devices allows them to be used in conjunction with standard silicon semiconductors. But there is no mention of their use with other nanocluster technology and there is no mention of integration of the device with other specific opto-electronic devices.

L. Pavesi et. al., Optical Gain in Silicon Nanoclusters, Nature, Vol. 408, Nov. 23, 2000, pages 440–444, have described how silicon nanoclusters can be made to emit light by a means that is both efficient and demonstrates optical gain. The key feature is the small size of the silicon nanoclusters. The structures are three nanometers in diameter. Consequently, the number of silicon atoms that are at the interface to the silicon dioxide host are comparable to those silicon atoms that interface to other silicon atoms. Any electronic states that result from the formation of the interface will behave as if they are part of the silicon band structure itself. It was found that there was an interface state that could act as the ground or terminal electronic state for emission of light from silicon. Effectively, this allows silicon to become a direct band gap emitter, greatly increasing its efficiency.

SUMMARY

In a broad aspect, the optical integrated circuit of the present invention includes a substrate; and, a plurality of optical elements supported by the substrate being optically coupled with each other, each optical element comprising silicon nanoclusters and having a desired opto-physical interaction with light impinging thereon.

These optical elements may be, for example, optical sources, optical waveguides, optical switches and optical detectors.

The advantages with an integrated optical circuit, as it is being presented herein, are analogous to the advantages when integrated electronic circuits were first introduced. In the short term, an optical integrated circuit will be much smaller than a circuit produced by connecting components. The optical circuit can be manufactured quickly and monolithically. Since the optical elements share a common substrate, the manufacture is more robust, allowing it to survive harsher mechanical environments (i.e. the circuit can be subjected to higher acceleration and jerk without loosing mechanical integrity). The use of common physical materials implies that the circuit will undergo uniform expansion and contraction with temperature. Thus, the circuit can survive larger changes in temperature without malfunction.

In the long term, prices per element will drop as manufacturing improves, akin to the reduction of cost per transistor on an integrated electronic circuit. The density of optical elements will increase, leading to increased device function. The small sizes will eventually allow technical synthesis into technology that could benefit from optical devices, but presently cannot because of size and sensitivity.

Other objects, advantages, and novel features will become apparent from the following detailed description of the invention when considered in conjunction with the accompanying drawings.

DETAILED DESCRIPTION OF THE INVENTION

Figure 1:
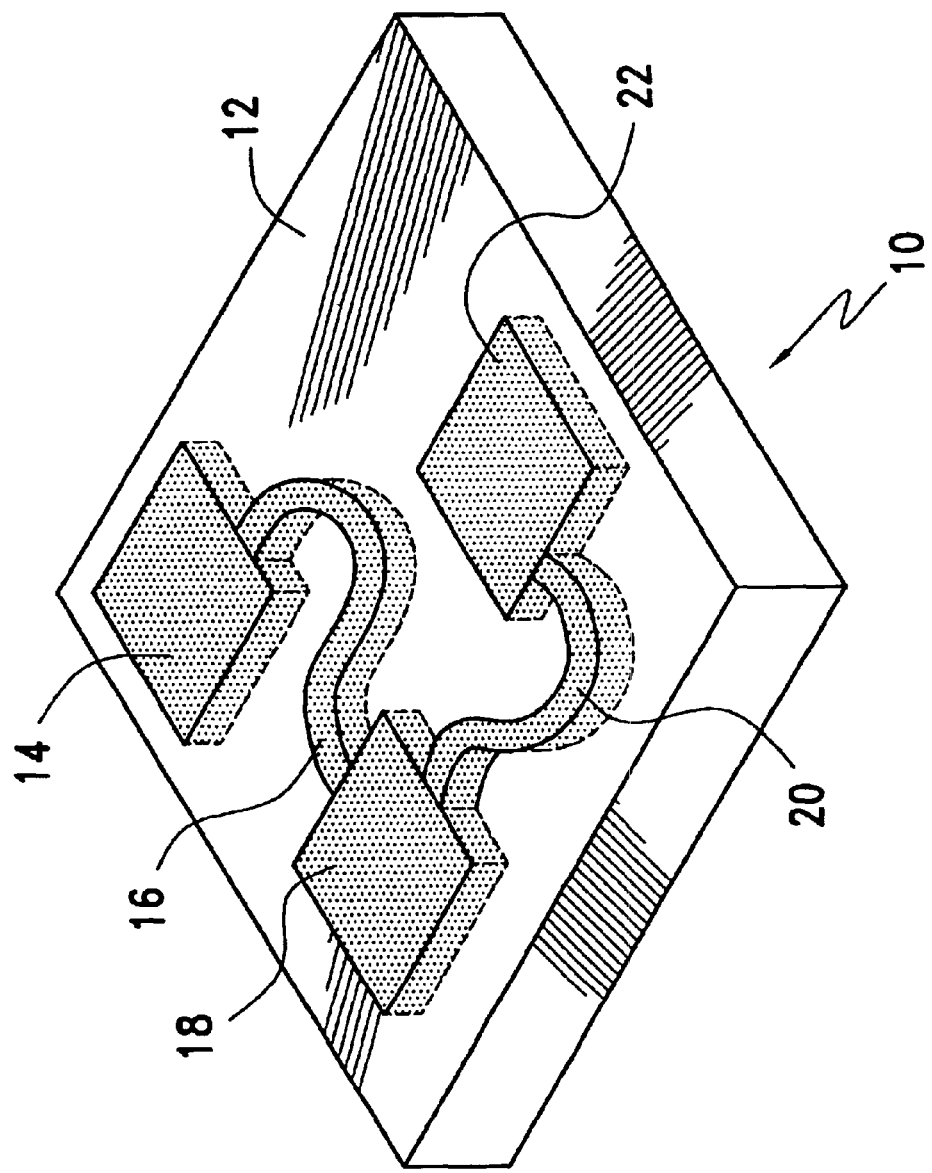
FIG. 1 is a schematic representation of the optical integrated circuit of the present invention.

Referring now to the drawings and the characters of reference marked thereon, FIG. 1 illustrates a preferred embodiment of the optical integrated circuit of the present invention, designated generally as 10. The optical integrated circuit 10 includes a substrate 12 for supporting optical elements. In this situation, the physical properties of the silicon nanostructures depend strongly on the exact substrate into which they are embedded. Therefore, the substrate material should be some variation of silicon dioxide. This could be, for example, crystalline quartz or glass. It could also be an intermediary or quasi-crystal between the two, known as amorphous quartz.

A source of photons, e.g. laser source 14, mounted on the substrate 12, receives electrical outputs from appropriate electrically manifested information streams and generates an optical output. These information streams could be digitally encoded voice communications, digital computer communications or any manner of electronic information currently processed by electronic means.

Given the substantial legacy associated with silicon manufacturing, as well as the accompanying manufacturing experience associated with semiconductor diode laser manufacture, ideally, one would desire to manufacture a laser from silicon. Unfortunately, as a crystal, silicon possesses an indirect electronic bandgap. That is, the emission of a photon during the lasing process is coupled to the emission of a phonon or lattice vibration. This makes the light production process very inefficient for use as a light source.

As noted above, recent work performed by L. Pavesi et. al. has shown that this difficulty can be solved by using silicon nanoclusters. Specifically, small Si structures (with diameters of a few nanometers) can be imbedded in quartz, which is chemically $SiO_2$. Work conducted relative to this material shows that a radiative state associated with the nanocrystal-oxide interface acts as a ground state for the silicon lasing transition. That state allows the silicon nanocluster to lase as if it were a direct bandgap, increasing the efficiency to a level where it can be used within an integrated optical circuit. In fact, L. Pavesi demonstrated efficient optical gain in the nanoclusters. With the appropriate optical feedback, this system of optical gain can be adapted into a lasing configuration. Optical feedback may be provided by, for example, imbedded micro-mirrors that provide feedback to the optical gain medium. At this point, the silicon nanoclusters can be used as a source of photons.

There may be certain applications where the photons to be used should be incoherent in phase, instead of the phase coherent type produced by a laser. In this situation, an incoherent light source could still be produced with silicon nanoclusters. In U.S. Pat. No. 6,319,427, Ozin, et. al describe how silicon nanoclusters can be made to photoluminese so as to emit light. (In their specific example, their photon source involves the use of material in the form of a film and containing stabilized clusters of silicon atoms, of average diameters of 2 nanometers or less. The clusters are capable of electroluminescence on application of appropriate current or voltage across the film, to emit fast photons. U.S. Pat. No. 6,319,427 is incorporated herein by reference, in its entirety. As the optical emitter herein is formed of silicon nanoclusters, it can act as a photon source.

The optical output of the optical source 14 may be directed by use of an optical waveguide 16 that is similarly formed of silicon nanoclusters. In order to create an effective optical waveguide, for example, a fiber optic waveguide, the essential physical response needed is total internal reflection. That is, the optical signal must be propagating in a material in which its phase vector has a larger magnitude than it would in the surrounding material. Put in other physical quantizations, the index of refraction in the waveguide material should be larger than the index in the surrounding material. Silicon dioxide, glass or quartz has a refractive index of approximately 1.5. Recent measurements have shown that silicon nanoclusters have an estimated refractive index of 1.89. Thus, the above stated waveguide criterion is met. A region of silicon nanoclusters embedded in a substrate of quartz maintains the optical signal propagating along the nanocluster path.

The waveguides will be formed by means analogous to other silicon nanostructure devices. The nanocrystals are produced by negative ion implantation into the quartz substrate. Alternately, they can be implanted into thermally grown silicon dioxide layers on Si substrates. In either case, this is followed by a high temperature (approximately 1000° C.) annealing process.

The optical waveguide directs the optical output to another optical element, for example, an optical switch 18 that is also formed of silicon nanoclusters. The switch 18 modulates one or more of the physical properties of the optical output.

In order for a material to be used as an optical switching medium or so-called photonics device, it must have a good nonlinear optical response. The switching will occur as the result of the material's response to an external electric field. The modulation of the material's optical properties must be strong enough so that the optical signals moving through it will be affected.

Recent work conducted relative to silicon nanoclusters has shown it to have an excellent nonlinear optical response. Silicon nanoclusters embedded in quartz showed large second order susceptibilities when measured with second harmonic generation. The susceptibility tensor associated with second harmonic generation derives its microscopic terms from analogous physical properties to that used in the response to an external electric field. That is, as a result of the good second harmonic measurements, the material interacts strongly with an external field. Consequently, silicon nanoclusters are usable as optical switching elements.

Further showing of the utility of silicon nanoclusters for optical switching is discussed by H. W. H. Lee et. al. (in *Nonlinear Optics, Materials Fundamentals and Applications*, Washington D.C. 2000.) Measurements on the Kerr indices (a nonlinear optical effect closely related to electronic modulation of refractive index) show large coefficient values ($7 \times 10^{-11}$ to $2 \times 10^{-13}$ $cm^2/W$) with response times that are as low as the femtosecond range.

The silicon nanoclusters in this configuration are prepared by implanting Si ions into fused silica substrates, also known as amorphous quartz. Alternately, they can be embedded into $SiO_2$ films on Si substrates. Implanted structures are annealed to precipitate the nanocluster formation. As with all optical switches, an external electric field is applied by putting a voltage across an electrode structure. The external electric field couples with the material, changing the index of refraction. By using this change in the refractive index, the characteristics of the optical signal can be modulated.

The output of the optical switch 18 may be re-directed via a second waveguide 20 to another optical element, for example an optical detector 22 for receiving the re-directed output and generating a corresponding electrical output. The detector 22 is also preferably formed of silicon nanoclusters.

The use of silicon as a means to change an optical signal to a corresponding electrical signal is well established. Silicon's internal electronic structure allows photons at wavelengths equal to or shorter than 1.1 micron to be absorbed. In so doing, an electron in the lower energy valence band is promoted into the higher energy conduction band. Once the electron is there, it can be interacted with by normal electronic means.

Silicon nanoclusters maintain enough of their bulk crystal electronic properties that they also can act as detector appropriate material. Silicon nanoclusters absorption profiles have been measured and shown to be usable for converting optical signals into information equivalent electronic signals. Furthermore, since the nanoclusters can be engineered (that is, their size and density can be controlled) their linear optical behavior can be tailored to optimize their performance in the specific configuration that they are placed in.

As with the silicon nanocluster used in the photon source, optical waveguide and optical switch, the nanoclusters here are formed by a two step process. Silicon atoms are implanted into a $SiO_2$ substrate by ion implantation. This is followed by an annealing process. The resulting structure will act as a detector when biased with the appropriate voltage and electrical outputs are collected through electrical conductors. Although the optical integrated circuit has been described with respect to an optical switch 18 positioned between the laser source 14 and the detector 22 it is understood that this was shown by way of example. Various combinations of optical elements can be provided. For example, there may be multiple sources of optical signals at different positions on the substrate. These sources may be of the same wavelength or may be of slightly different wavelengths. There can be many optical switches on the substrate. They may be performing the job of routing the direction of the signals or they may be changing the digital information that is encoded in those signals. There may be many detectors located at many positions on the substrate. With many elements in the integrated optical circuit, the waveguide may not merely be point to point, but may be manifested as an optical network.

Obviously, many modifications and variations of the present invention are possible in light of the above teachings. It is, therefore, to be understood that within the scope of the appended claims, the invention may be practiced otherwise than as specifically described.

What is claimed and desired to be secured by Letters Patent of the United States is:

1. An optical integrated circuit, the optical integrated circuit comprising:
    a substrate having a plurality of silicon nanoclusters embedded within;
    an optical source formed on the substrate from at least a first one of said plurality of silicon nanoclusters;
    an optical waveguide formed on the substrate from at least a second one of said plurality of silicon nanoclusters and optically coupled to the optical source;
    an optical switch formed on the substrate from at least a third one of said plurality of silicon nanoclusters and optically coupled to the optical waveguide; and
    an optical detector formed on the substrate from at least a fourth one of said plurality of silicon nanoclusters and optically coupled to the waveguide;
    wherein each of the plurality of silicon nanoclusters has a physical composition including a nanocrystal-oxide interface along an outer surface of the silicon nanocluster, and wherein the nanocrystal-oxide interface is configured to provide an additional electronic state for silicon optical transitions to thereby produce a desired opto-physical interaction with light interacting with the nanocrystal-oxide interface.

2. The optical integrated circuit of claim 1, wherein the optical source comprises a laser.

3. The optical integrated circuit of claim 1, wherein the optical source comprises stabilized clusters of silicon atoms, of average diameters of 2 nanometers or less, wherein said clusters are capable of electroluminescence on application of appropriate current or voltage across the film, to emit fast photons.

4. The optical integrated circuit of claim 1, wherein the optical source is fanned by implanting silicon atoms into said substrate followed by an annealing process.

5. The optical integrated circuit of claim 1, wherein the optical source is formed by embedding silicon atoms into said substrate followed by an annealing process.

6. The optical integrated circuit of claim 1, wherein the optical waveguide is formed by implanting silicon atoms into said substrate followed by an annealing process.

7. The optical integrated circuit of claim 1, wherein the optical waveguide is formed by embedding silicon atoms into said substrate followed by an annealing process.

8. The optical integrated circuit of claim 1, wherein the optical switch is fanned by implanting silicon atoms into said substrate followed by an annealing process.

9. The optical integrated circuit of claim 1, wherein at the optical switch is formed by embedding silicon atoms into said substrate followed by an annealing process.

10. The optical integrated circuit of claim 1, wherein the optical detector is formed by implanting silicon atoms into said substrate followed by an annealing process.

11. The optical integrated circuit of claim 1, wherein the optical detector is formed by embedding silicon atoms into said substrate followed by an annealing process.

12. The optical integrated circuit of claim 1, wherein the substrate comprises $SiO_2$.

13. A monolithic optical integrated circuit formed on a substrate primarily composed of silicon dioxide and having a plurality of silicon nanoclusters embedded therein, the monolithic optical integrated circuit comprising:
    a laser source formed on the substrate from at least a first one of the plurality of nanoclusters, wherein the laser source is configured to receive an electrical output and to generate an optical output in response thereto;
    a first optical waveguide formed on the substrate from at least a second one of the plurality of silicon nanoclusters, wherein the first optical waveguide is configured to receive and to direct the optical output;
    an optical switch formed on the substrate from at least a third one of the plurality of silicon nanoclusters and configured to receive the directed optical output and to modulate one or more of the physical properties of said directed optical output;
    a second waveguide formed on the substrate from at least a fourth one of the plurality of silicon nanoclusters and configured to receive the modulated optical output and to re-direct said modulated optical output; and
    an optical detector formed on the substrate from at least a fifth one of the plurality of silicon nanoclusters and configured to receive the re-directed optical output from said second waveguide and to generate a corresponding electrical output;
    wherein each of the plurality of nanoclusters has a physical composition comprising a nanocrystal-oxide interface along an outer surface that provides an electronic state for silicon optical transitions to thereby produce opto-physical interactions with light interacting with the nanocrystal-oxide interface.

* * * * *

UNITED STATES PATENT AND TRADEMARK OFFICE
CERTIFICATE OF CORRECTION

PATENT NO. : 6,822,305 B2
DATED : November 23, 2004
INVENTOR(S) : Jeffrey H. Hunt It is certified that error appears in the above-identified patent and that said Letters Patent is hereby corrected as shown below:

Column 5,
Line 57, delete "fanned" and add -- formed --.

Column 6,
Line 11, delete "fanned" and add -- formed --.

Signed and Sealed this

Fifth Day of April, 2005

JON W. DUDAS
*Director of the United States Patent and Trademark Office*